(12) United States Patent
Adachi et al.

(10) Patent No.: US 7,402,995 B2
(45) Date of Patent: Jul. 22, 2008

(54) JIG DEVICE FOR TRANSPORTING AND TESTING INTEGRATED CIRCUIT CHIP

(75) Inventors: Tomoaki Adachi, Kawagoe (JP); Yasuko Chinone, Ibaraki-ken (JP)

(73) Assignee: Unitechno, Inc, Tokyo (JP)

( * ) Notice: Subject to any disclaimer, the term of this patent is extended or adjusted under 35 U.S.C. 154(b) by 269 days.

(21) Appl. No.: 11/029,827

(22) Filed: Jan. 5, 2005

(65) Prior Publication Data

US 2005/0156166 A1 Jul. 21, 2005

(30) Foreign Application Priority Data

Jan. 7, 2004 (JP) ............................. 2004-002150

(51) Int. Cl.
*G01R 31/06* (2006.01)
(52) U.S. Cl. ............... 324/158.1; 324/765; 324/754
(58) Field of Classification Search ......... 324/754–765, 324/158.1, 73.1; 439/482, 824
See application file for complete search history.

(56) References Cited

U.S. PATENT DOCUMENTS

| 4,496,903 | A | * | 1/1985 | Paulinski ................... 324/761 |
| 5,500,605 | A | * | 3/1996 | Chang ........................ 324/758 |
| 5,656,942 | A | * | 8/1997 | Watts et al. .................. 324/754 |
| 6,046,597 | A | * | 4/2000 | Barabi ........................ 324/755 |
| 6,229,322 | B1 | * | 5/2001 | Hembree ..................... 324/755 |
| 6,893,069 | B1 | * | 5/2005 | Graham ..................... 294/64.1 |

FOREIGN PATENT DOCUMENTS

JP 07-294600 10/1995

* cited by examiner

*Primary Examiner*—Vinh P. Nguyen
(74) *Attorney, Agent, or Firm*—RatnerPrestia

(57) ABSTRACT

A novel jig device useful for transporting and testing an IC chip is disclosed. The jig device comprises a main jig body, having a holding part onto which the IC chip to be tested is attracted and held and at least one suction path is formed, and at least one contact probe arranged in the suction path of the main jig body. The main jig body comprises preferably a base part and front head part. The contact probe connects electronically between a terminal of the IC chip held at the holding part and an electrode of circuit board of tester.

6 Claims, 7 Drawing Sheets

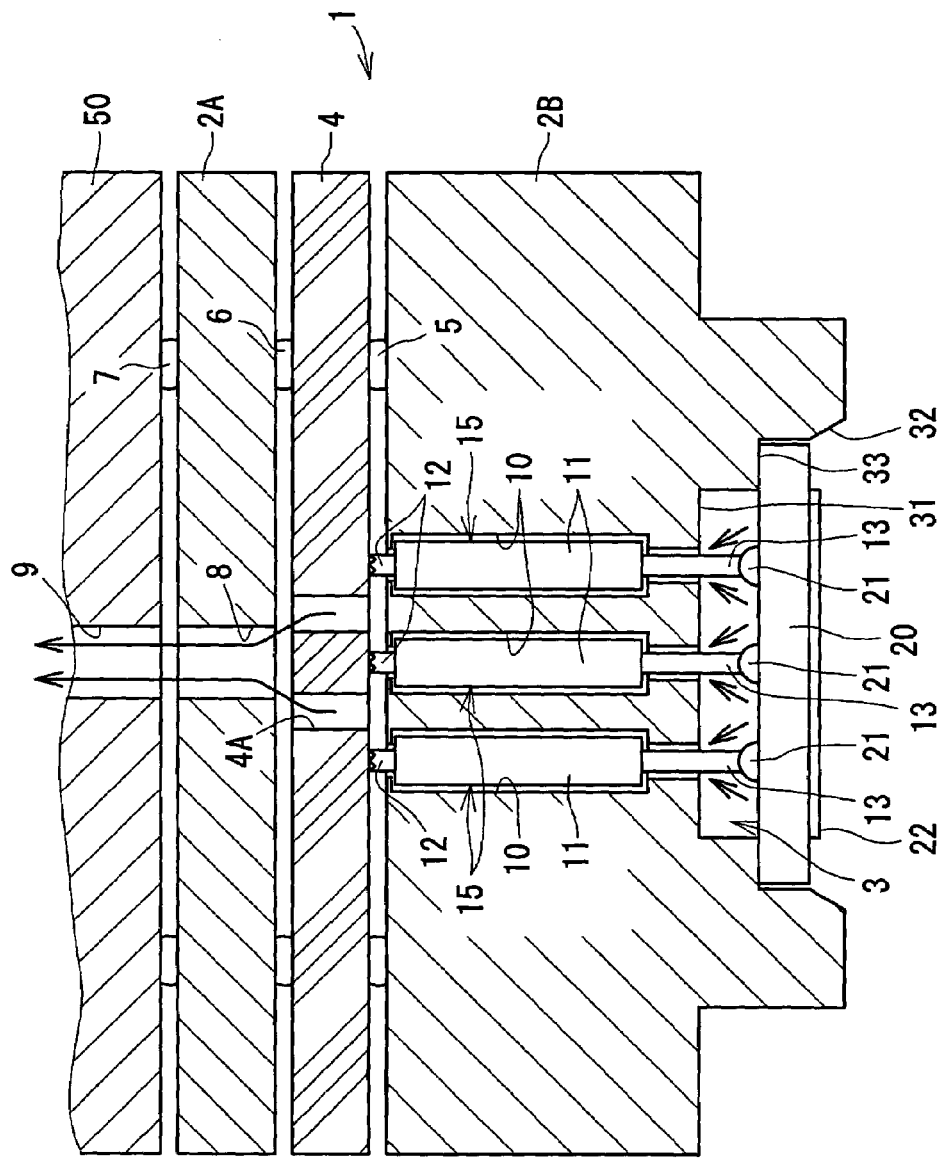

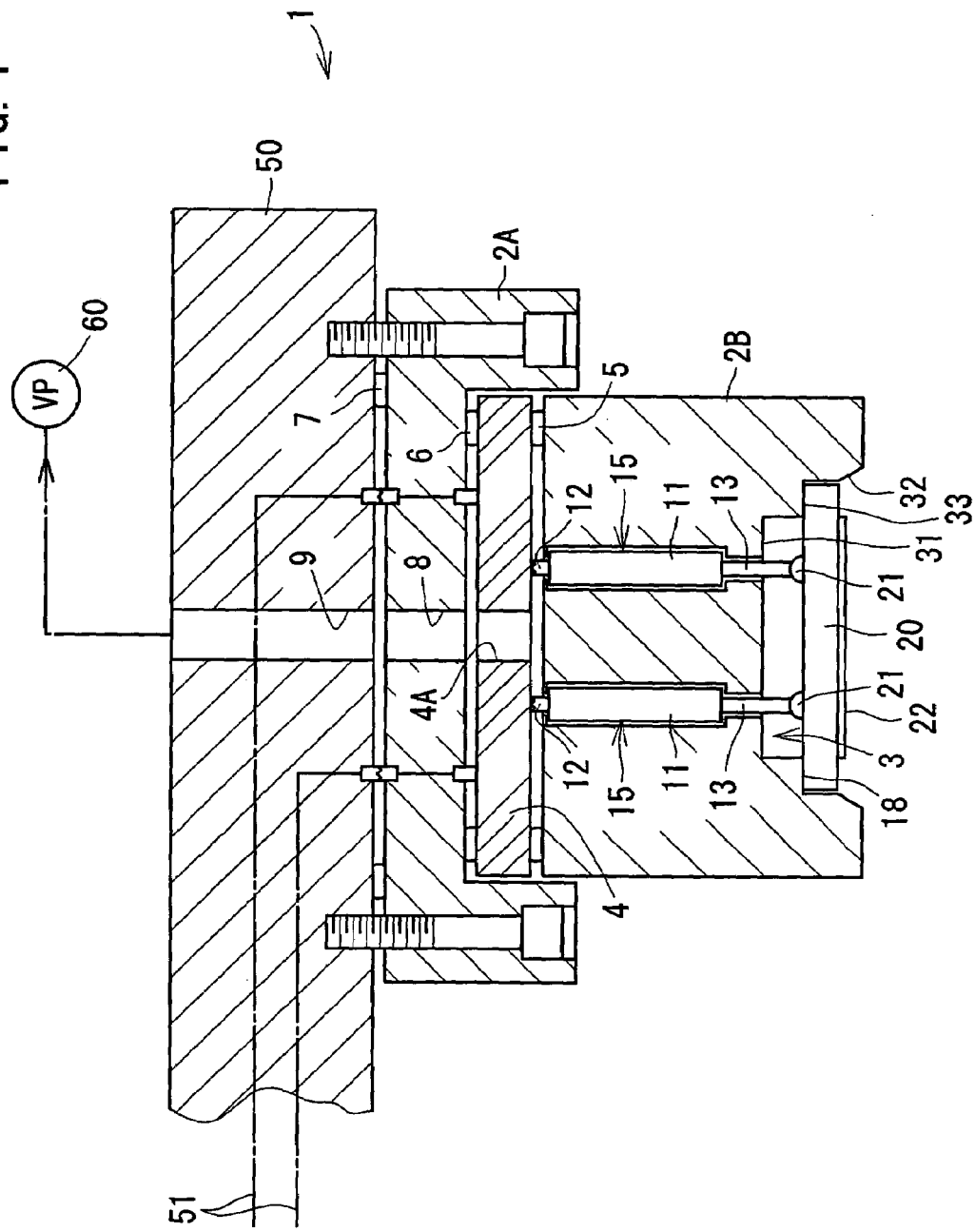

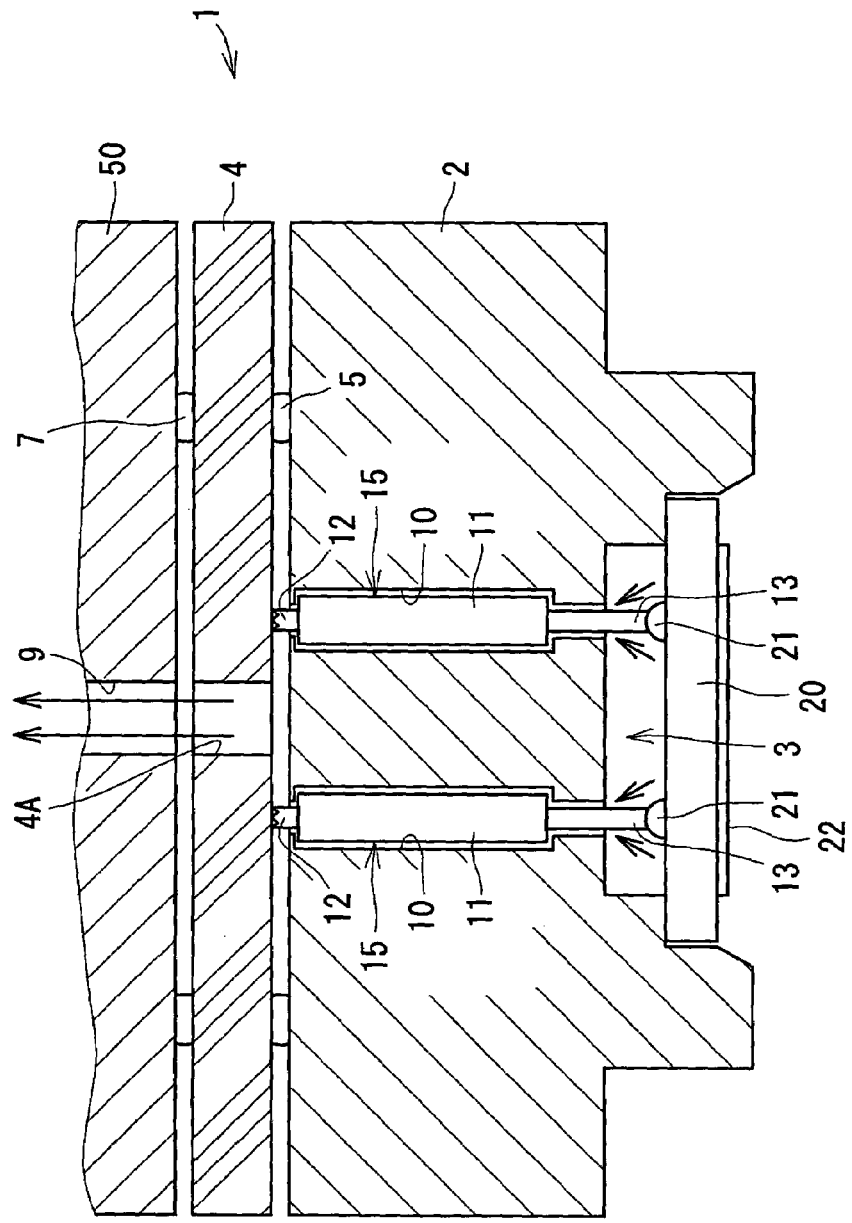

JIG DEVICE FOR TRANSPORTING AND TESTING INTEGRATED CIRCUIT CHIP

CROSS REFERENCE TO RELATED CASES

This application is based on Japanese patent application Ser. No. 2004-2150, filed on Jan. 7, 2004, contents of which are incorporated hereinto by reference.

BACKGROUND OF THE INVENTION

1. Field of the Invention

The present invention relates to a jig device for transporting and testing a semiconductor integrated circuit chip, simply called as 'IC chip' hereinafter. Particularly, the present invention relates to a novel jig device useful for transporting and testing a small and lightweight IC chip having test areas on both of front and back surfaces thereof and to a novel method for transporting and testing the same using the jig device.

2. Description of the Related Art

Up until now, there have been proposed a wide variety of conventional means for transporting an IC chip at its stage. According to the conventional means, an IC chip to be tested is picked-up from a tray or packet by a transporting device having handler and is conveyed to a predetermined test place, where the IC chip is put in a socket for testing electrical conductivities and other properties thereof.

A transporting device having a handler for conveying IC chips from one place to another place during their test stage is disclosed in Japanese published patent application (kokai) H07-294600. The transporting device has a handler equipped with a vacuum pad for sucking one surface of the IC chip. The vacuum pad attracts to pick-up the IC chip from a tray to convey it to a socket for testing, where electric terminals on front surface of the IC chip contact with measurement electrodes of the test socket.

The handler of the conventional transporting device has a vacuum pad for sucking to attract and grip almost the whole area of the front surface of the IC chip. However, such transporting device is not useful for handling some kinds of IC chips, such as IC chips of BGA (ball grid array package), PGA (pin grid array package) or LGA (land grid array package). As electric terminals and/or optical image pick-up elements of these IC chips are arranged on almost whole surfaces of their front and back surfaces, they can hardly have sufficient area on any surface for contacting with the vacuum pad. Therefore, it is difficult to handle such IC chips using the conventional devise.

If the handler has a mechanism for pinching an IC chip from transverse directions, the IC chip may be pinched to pick-up at side surfaces of the chip, other than front and back surfaces. However, two or more arms are necessary in order to pinch the IC chip and construction and mechanism of the handler may be complicated. Furthermore, such handler will be inapplicable to handle small IC chips, since small IC chips generally have no suitable portion to be pinched securely by the arms.

Moreover, conventional transforming devices have a function only to convey an IC chip and therefore it is necessary another means to set up the IC chip in test equipments after the conveyance. This results in that lead-time for test stage is still large.

As mentioned above, any conventional transporting device can hardly handle small IC chips having a lot of terminals or optical imaging elements on their front and back surfaces and it is applicable only for conveying IC chips. Therefore, a practical jig device useful for both of transporting and testing small IC chips is not known yet, for the time being.

SUMMARY OF THE INVENTION

Therefore, an object of the present invention is to provide a novel jig device useful for both of transporting and testing an IC chip without drawbacks mentioned above. Another object of the present invention is to provide a method for transporting and testing an IC chip using the novel jig device.

According to the present invention, there is provided that a novel jig device useful for transporting and testing an IC chip comprising:

(i) a main jig body composed essentially of a non-conductive material having a holding part formed thereon, onto which said IC chip to be tested is sucked uo and held and having at least one internal suction path for sucking up said IC chip to said holding part, and (ii) at least one contact probe equipped in said main jig body, whereby terminals of said IC chip are connected electrically with a circuit board for test.

The main jig body is made of a non-conductive material, such as non-conductive metal, plastics or ceramics. In a preferable embodiment, the main jig body comprises a base part and a front head part. The base part has at least one suction path therein leading to a sucking instrument such as vacuum pump. The front head part also has at least one suction path therein, which communicated with the suction path of the base part. The main jig body may be joined to a robot arm.

The jig device is preferably equipped with an electric circuit for test, such as a printed circuit board communicated with a tester. The electric circuit may be arranged between the base part and the front head part of the main jig body. In this embodiment, the base part, the electric circuit and the front head part are assembled into a jig device.

The front head part of the main jig body has a holding part which may be a concavity formed on top or bottom of the front head part. One end of the suction path opens at inside of the concavity so that the IC chip to be tested is attracted by suction and is fitted into the holding part. Size and shape of the concavity should be adjusted according to size and type of the IC chip to be tested. Preferably, entrance of the concavity is broadened gradually toward its opening to form a cone-shaped space at the entrance for introducing smoothly the IC chip into the concavity, and a terrace, or a step, is formed on surrounding wall of the concavity. In such preferable embodiment, only a peripheral area of front surface of the IC chip contacts to the terrace when the IC chip attracted into the holding part. This means that the IC chip touches the jig device at only a peripheral area of its front surface other than main area where many terminals are prepared.

In another embodiment of the jig device, the concavity of the holding part may have a vertical surrounding wall and the IC chip contacts at side surface thereof with the vertical surrounding wall. In this case, only side surfaces of the IC chip contact with the main jig boy and front and back surfaces thereof do not contact with the main jig body.

The jig device may be equipped with an electric circuit for testing, such as a printed circuit board, which is communicated electrically with a tester. The electric circuit is preferably arranged between the base part and the front head part of the main jig body. The base part, the printed circuit board and the front head part are assembled into a jig device. The base part of the main jig body joins preferably to a robot arm.

The main jig body, however, may be constructed as a single part. In such embodiment, the printed circuit board is arranged between the main jig body and the robot arm.

The jig device of present invention is equipped with at least one contact probe made of a conductive material such as conductive metal. In most case, each of the contact probes is accommodated respectively in each of the suction paths formed in the main jig body, more specifically, in the front head part of the main jig body. Each contact probe is extending in each suction path along with its length direction and is arranged in each suction path one by one, so that there is a space between each contact probe and inner wall of each suction path. One end of the contact probe contacts with an electrode of the printed circuit board and another end thereof contacts with a terminal of the IC chip at test stage.

The contact probe is generally spring-loaded probe, which is flexible in length direction thereof. For more detail, the contact probe comprises an intermediate tubular holder and two contact pins, i.e., first contact pin and second contact pin. Upper end of the first contact pin and lower end of the second contact pin project out of the tubular holder respectively and, further, lower end of the first contact pin and upper end of the second contact pin are inside of the tubular holder. The first and second contact pins may have respective flanges at their end and they are linked with each other by a compressed spiral spring equipped in the tubular holder to give a load the both contact pins toward reverse directions. As each of the contact probes is flexible in length, the contact probe can touches with a terminal of the IC chip under sufficient pressure, while the IC chip to be tested is held at the holding part of the main jig body. As the result, reliable tests or inspections can be conducted. However, contact probes other than the described above can be also applicable.

Electrical tests of the IC chip can be performed by contacting the contact probes with terminals on front surface of the IC, while it is held at the holding part of the main jig body. If the IC chip has optical image pick-up element on back surface, optical tests can be also conducted simultaneously by exposing the back surface to a light.

The jig device according to this invention can be used for both of transportation and test or inspection of an IC chip while it is held at only a peripheral area of the front surface of the IC chip.

Moreover, size of the jig device is small in spite of including many contact probes therein, because each contact probe is built-in in each suction path and, therefore, the miniaturization of the whole test appliance can be attained.

Furthermore, the jig device is able to electrical and optical performances at same time. These will result in that lead-time for test procedures including preparing stage of the testing can be shortened substantially.

In accordance with the jig device of this invention described above, conveyance and test of an IC chip having terminals and optical elements on almost whole surfaces can be conducted by same jig device, even if the IC chip is small one or a chip of BGA, PGA or LGA.

According to the present invention, there is also provided a novel method for transporting an IC chip to predetermined place and testing the same at said predetermined place using the above-mentioned jig device.

The method comprises;

(a) a step for preparing a jig device comprising:
  (i) a main jig body composed essentially of a non-conductive material having a holding part formed on top or bottom thereof, onto which the IC chip to be tested is attracted and held and having at least one internal suction path for attracting the IC chip to the holding part, and (ii) at least one contact probe equipped in the main jig body, whereby terminals of the IC chip can be connected electrically with a circuit board for testing.

(b) a step for attracting the IC chip by suction so that the IC chip contacts with the holding part of the jig device, (c) a step for transporting the IC chip to predetermined test place while the jig device is gripping the IC chip onto the holding part, (d) a step for testing the IC chip at the predetermined test place, under a state that the IC chip is held by the jig device, wherein an electrical test is performed by contacting upper and lower ends of the contact probe are connected with the terminal on the IC chip and the electrode of the circuit board, respectively, and (e) a step for transporting the IC chip which has been tested to a tray for carrying to next processing stage while the IC chip is held by the jig device.

In accordance with the method of the invention, conveyance and property tests of the IC chip can be conducted within short period and therefore lead-time for test procedures can be reduced.

BRIEF DESCRIPTION OF THE DRAWINGS

FIG. 1 is a cross-sectional view of a jig device, which is first embodiment of the present invention.

FIG. 4 is a cross-sectional view of a jig device, which is second embodiment of the present invention.

FIG. 7 is a cross-sectional view of a jig device, which is fifth embodiment of the present invention.

DETAILED DESCRIPTION OF PREFERRED EMBODIMENTS

Figure 2A:
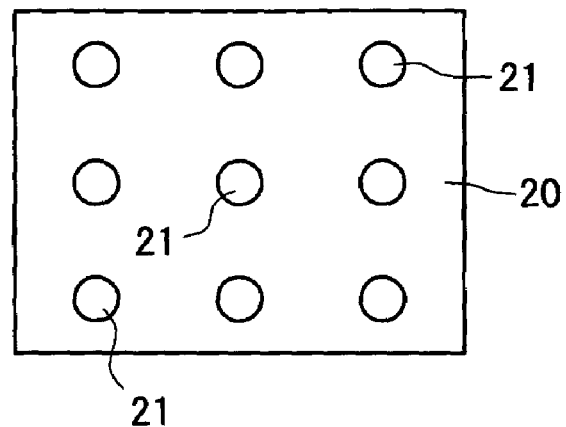
FIG. 2A is a plain view of front surface of an IC chip to be tested.

The present invention will be described in details hereinafter with reference to the accompanying drawings.

Referring to FIG. 1, the jig device 1, an embodiment of the present invention, comprises a main jig body including a base part 2A and a front head part 2B made of a non-conductive material, and contact probes 15 made of a conductive material which are accommodated in the main jig body. The base part 2A of the main jig body is joined detachably to a head of a robot arm 50. The front head part 2B of the main jig body has a holding part 3 which is a concavity 31 formed at bottom of the front head part 2B, into which an IC chip 20 to be tested will fit. A printed circuit board 4 is laid between the base part 2A and the front head part 2B. The printed circuit board 4 is connected electrically to the control part of tester, which is not illustrated in the drawing, through the robot arm 50. An annular air seals 5, 6 and 7 are prepared appropriately between these parts.

Suction paths 9 and 8 are formed in the robot arm 50 and the base part 2A of the main jig body, respectively. Suction paths 4A are also formed in the printed circuit board 4. As shown in FIG. 1, these suction paths 9, 8 and 4A communicate with each other. The suction path 9 is led to a vacuum pump, not illustrated in the drawing. There are also plural suction paths 10 in the front head part 2B of the main jig body. Numbers of suction paths 10 in the front head part 2B corresponds to numbers of terminals of the IC chip 20 to be tested. Each of the suction paths 10 communicates with the suction paths 4A in printed circuit board 4.

Figure 2B:
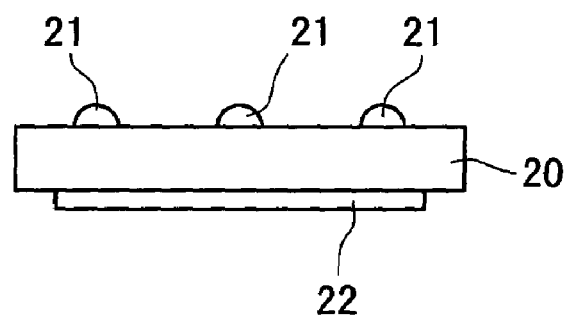
FIG. 2B is a side view of the same.
Figure 2C:
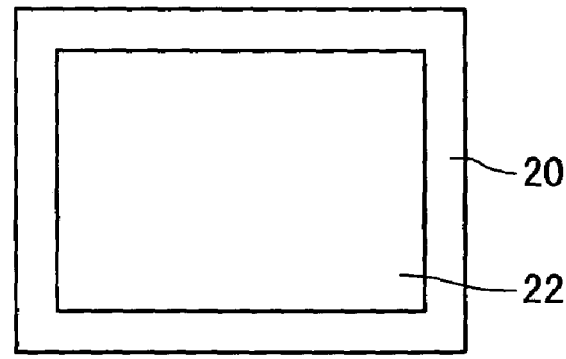
FIG. 2C is a plain view of back surface of the IC chip.

Electric terminals 21 are arranged on almost whole area of front surface of the IC chip and an optical image pick-up element 22 is prepared in back surface thereof, as shown in FIGS. 2A, 2B and 2C.

The vacuum pump, not illustrated in the drawing, is equipped in the robot arm 50. Sucking through the suction paths 4A, 8, 9 and 10 by the vacuum pump, the IC chip 20 is attracted and gripped into the holding part 3, which is formed on the bottom of the front head part 2B. Due to the air seals 5, 6 and 7, spaces inside of the base part 2A and front head part 2B are decompressed by the suction in order to attract the IC chip 20 to the holding part 3 during transportation and test procedures.

The front head part 2B of the main jig body has a concavity 31 on its bottom. The concavity 31 functions practically as the holding part 3. One end of each internal suction path 10 opens inside of the concavity 31, so that the IC chip 20 to be tested is attracted there by the suction. Surrounding wall of entrance 32 of the concavity 31 is inclined to broaden inside diameter of the entrance 32 of the concavity 31 toward its opening and thus a cone-shaped introducing space is formed around the entrance 32. There is a terrace 33 at the surrounding wall of the concavity 31. In this embodiment, as the IC chip 20 contacts with the terrace 33 of the concavity 31 and is held there, the terrace 33 functions as a holding surface of the holding part 3. In other words, only a peripheral area of the front surface of the IC chip 20 touches with terrace 33 of the holding part 3. This means that a specific surface area alone contacts directly with the holding part 3 and remaining main area of the front surface of the IC chip 20 does not contact with the holding part 3.

A plurality of resilient contact probes 15 are equipped in front head part 2B of the main jig body. Each of the contact probes 15 extends in each of the suction paths 10, respectively, so that it leaves an appropriate space from inner wall of the suction path 10.

Figure 3A:
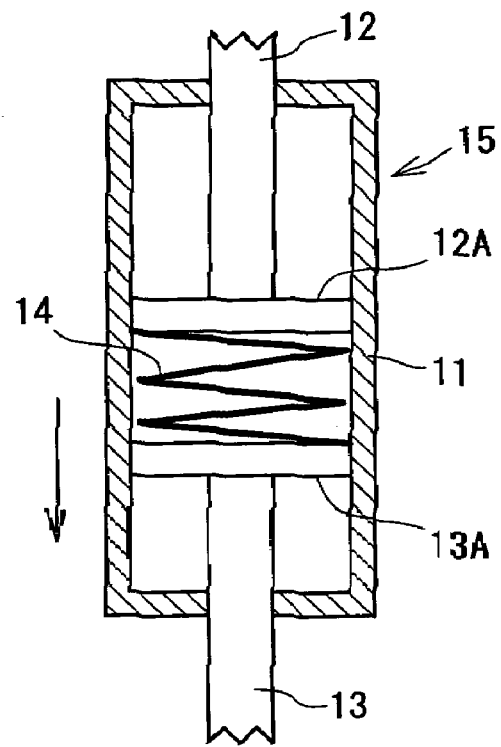
FIGS. 3A and 3B are cross sectional views of a contact probe, which is a part of the jig device, respectively.
Figure 3B:
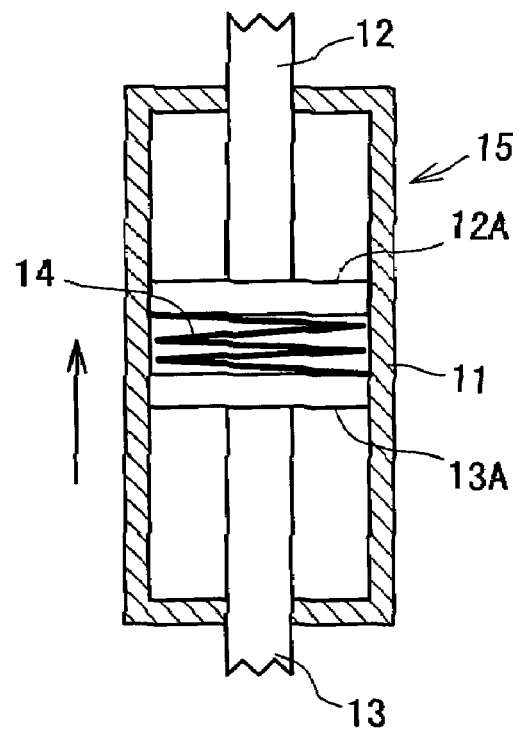

As illustrated in FIGS. 3A and 3B, the contact probe 15 is comprises a couple of contact pins, first contact pin 12 and second contact pin 13, and an intermediate tubular holder 11 having an inner hollow space extending to length direction thereof. Upper end of the first contact pin 12 contacts a printed circuit board 4 and lower end thereof are inside of the tubular holder 11. Lower end of the second contact pin 13 contacts a terminal 21 of the IC chip 20 and upper end thereof are inside of the tubular holder 11. Lower end of the first contact pin 12 and the upper end of second contact pin 13 have flanges 12A and 13A, respectively. Each of these flanges 12A and 13A can slide in the tubular holder 11.

A spiral spring 14 is equipped between the flanges 12A and 13A. The spring 14 usually gives a load to the contact pins 12 and 13 towards reverse directions. When the IC chip 20 is not yet held by the jig device 1, the second contact pin 13 is pushed down by the spiral spring 14 and the contact pin 13 projects out significantly from bottom end of the tubular holder 11, as illustrated in FIG. 3A. When the IC chip 20 is held at the holding part 3 and the terminals of IC chip 20 contacts with the second contact pin 13, the pin 13 is pushed up towards the first contact pin 12, so that whole length of the contact probe 15 becomes shorter, as shown indicted FIG. 3B.

A method of the present invention for transporting and testing an IC chip 20 using the above-mentioned jig device 1 will be described, hereinafter.

At First, the robot arm 50 is operated to move the jig device 1 towards a packet, not illustrated, in which the IC chip 20 to be tested are contained, and then move the jig device 1 so that the holding part 3 thereof approaches the front surface of the IC chip 20.

Subsequently, the jig device 1 is moved down to bring the holding part 3 close to the front surface of the IC chip 20 and then suction is started to attract and grip the IC chip 20 into the holding part 3, as indicated by arrows in FIG. 1. After second contact pins 13 of the contact probes 15 are connected with the corresponding terminals 21 of the IC chip 20, electrical tests of the IC chip 20 are performed by applying electrical current to contact probes 15 from the printed circuit board 4. Simultaneously, optical tests are also conducted by outputting a signal to the optical image pick-up element 22 from the printed circuit board 4 while a light is irradiated from beneath.

When a series of tests are completed, the jig device 1 moves by the robot arm 50 onto a tray for taking out. Suspending operation of the vacuum pump, the IC chip 20 is detached from the holding part 3 of the jig device 1 to put down into the tray, and then preparation of next test procedure as to the following IC chip will be started.

According to the above-mentioned embodiment of the present invention, the IC chip 20 is held securely on the holding part 3 of the jig device 1 by sucking during transportation and test procedures, even if the IC chip 20 has terminals 21 and an optical imaging element 22 on almost whole surfaces thereof. Furthermore, as the contact probes 15 can contact surely with terminals 21 on front surface of the IC chip 20, stable electric tests as to the terminals 21 can be conducted. Optical properties of the image pick-up element 22 on the opposite surface of the IC chip 20 can also be inspected simultaneously. Therefore, even if the IC chip 20 to be tested is a small-sized one having electric terminals and optical elements are prepared on front and back surfaces, efficient transportation and electric and optical tests of such IC chip can be conducted.

In addition to the above, the jig device 1 can be small-sized, since each contact probes 15 are built-in suction paths 10 of the front head part 2B, and thus the downsizing of the whole jig device 1 can be attained.

Moreover, since each of the contact probes 15 is constituted elastically in the length direction, it securely connected with a corresponding terminal 21 of the IC chip 20 and, therefore, stable and reliable test can be performed during the IC chip 20 is contacted and gripped onto the holding part 3.

Another jig device for conveyance and test of IC chip, which is the second embodiment of the present invention, is illustrated in FIG. 4. In this drawing, the same numerical references are given to same parts of the jig device as the first embodiment shown in FIG. 1, for avoiding repetition of similar explanations.

The jig device illustrated in FIG. 4 has main jig body comprising a base part 2A positioned just below a robot arm 50 and a front head part 2B attached beneath of the base part 2A. A printed circuit board 4 is fitted in a room between the base part 2A and the front head part 2B. Electric wires 51 from tester are led to the printed circuit board 4 through the robot arm 50 and the base part 2A of the main jig body.

Suction paths 9, 8 and 4A are formed in the robot arm 50, the base part 2A of the main jig body and the printed board 4, respectively. The suction path 9 in the robot arm 50 is led to a vacuum pump 60 and the suction path 4A in the print circuit board 4 is communicated to plural suction paths 10 formed in the front head part 2B. Air seals 5, 6 and 7 are provided in appropriate positions between these parts.

The structure and construction of the front head part 2B is similar to the jig device 1 shown in FIG. 1. A method for transporting and testing an IC chip 20 using this jig device 1 is also substantially same as the first embodiment explained hereinbefore.

Figure 5:
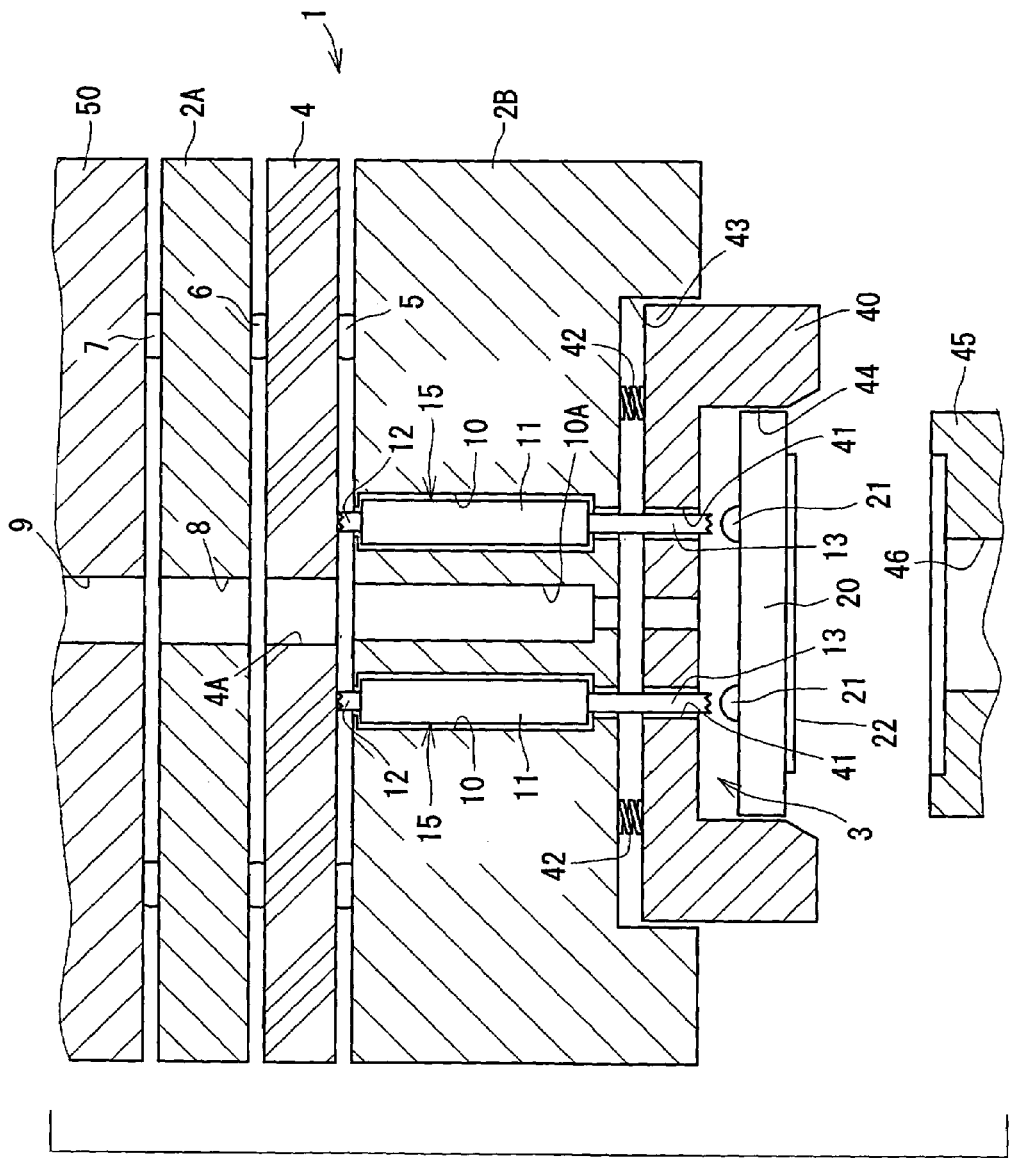
FIG. 5 is a cross-sectional view of a jig device, which is third embodiment of the present invention.

FIG. 5 illustrates a jig device which is the third embodiment of the present invention. The same numerical references are given to parts same as the first embodiment in this drawing, too.

In FIG. 5, a positioning platform 40 is additionally provided in the wearing part 43 formed in bottom of a front head part 2B of the main jig body. The positioning platform 40, which is also a part of the jig device 1 of the present invention, is mounted in a wearing part 43 of the front head part 2B by springs 42. A concavity is formed in bottom part of the positioning platform as a holding part 3 into which the IC chip 20 fits. In this embodiment, side surfaces of the IC chip 20 may contact with the surrounding wall 44 of the concavity to be held there.

Suction paths 41 are prepared also in the positioning platform 40. Each of the suction paths 41 communicated to each of the corresponding suction paths 10 and 10A of the front head part 2B and the suction paths 41 open at inside of the concavity of the positioning platform 40. These suction paths 41 are communicated to a vacuum pump, not illustrated, via suction paths 4A, 8, 9, 10 and 10A. Contact probes 15 are equipped in the suction paths 10, and, lower ends of second contact pins 13 of contact probes 15 are extending below through the suction paths 41 in the positioning platform 40.

For conducting tests, the jig device 1 is moved by robot arm 50 to a packet in which the IC chips 20 to be tested are contained and then adjust its position so that the holding part 3 in the positioning platform 40 faces to the front surface of the IC 20 chip.

Subsequently, the jig device 1 is moved by operating robot arm 50 so that the holding part 3 of the positioning platform 40 approaches closely to the front surface of the IC chip 20 to be tested. Sucking the IC chip 20 through the suction paths 9, 8, 4A, 10, 10A and 41, the front surface of the IC chip 20 is gripped to stick into the holding part 3 in the positioning platform 40, as shown in FIG. 5.

A pressing stand 45 may be there below the jig device 1. When the jig device 1 gripping the IC chip 20 gets down over the pressing stand 45 by the robot arm 50, the back surface of the IC chip 20 touches to the pressing stand 45 and the pressing stand 45 supports the IC chip 20 from bellow. In this state, the IC chip 20 is put between the holding part 3 of the positioning platform 40 and the pressing stand 45. Upon moving down of the jig device 1, the IC chip 20 is pushed upward by pressing stand 45 and the contact probes 15 become shorter in their length direction. Thus, contact pins 12 and 13 of the contact probe 15 can contact certainly with the printed circuit board 4 and the terminal 21 of the IC chip 20, respectively, whereby a more stable electrical connection between them is ensured.

Electrical tests of terminals 21 are conducted by giving currents from a printed circuit board 4 to the contact probes 15. Optical tests of an optical image pick-up element 22 can be undertaken by signals outputted from the printed circuit board 4 at same time. A light may be introduced from lower potion to the optical element 22 through an opening 46 of the pressing stand 45.

As same as the first embodiment, when electrical and optical tests of the IC chip 20 are completed, the jig device 1 is moved by the robot arm 50 to a position of a tray for conveying to next stage. On stopping the suction, the IC chip 20 is released from the jig device 1 into the tray, and then preparation for tests of the following IC chip will be conducted.

Thus, the jig device of the third embodiment has an advantageous effect, in addition to same effects as the first and second embodiments, that suction power for attracting the IC chip can be reduced, as the IC chip 20 is supported up by the pressing stand 45 during the test stage.

Figure 6:
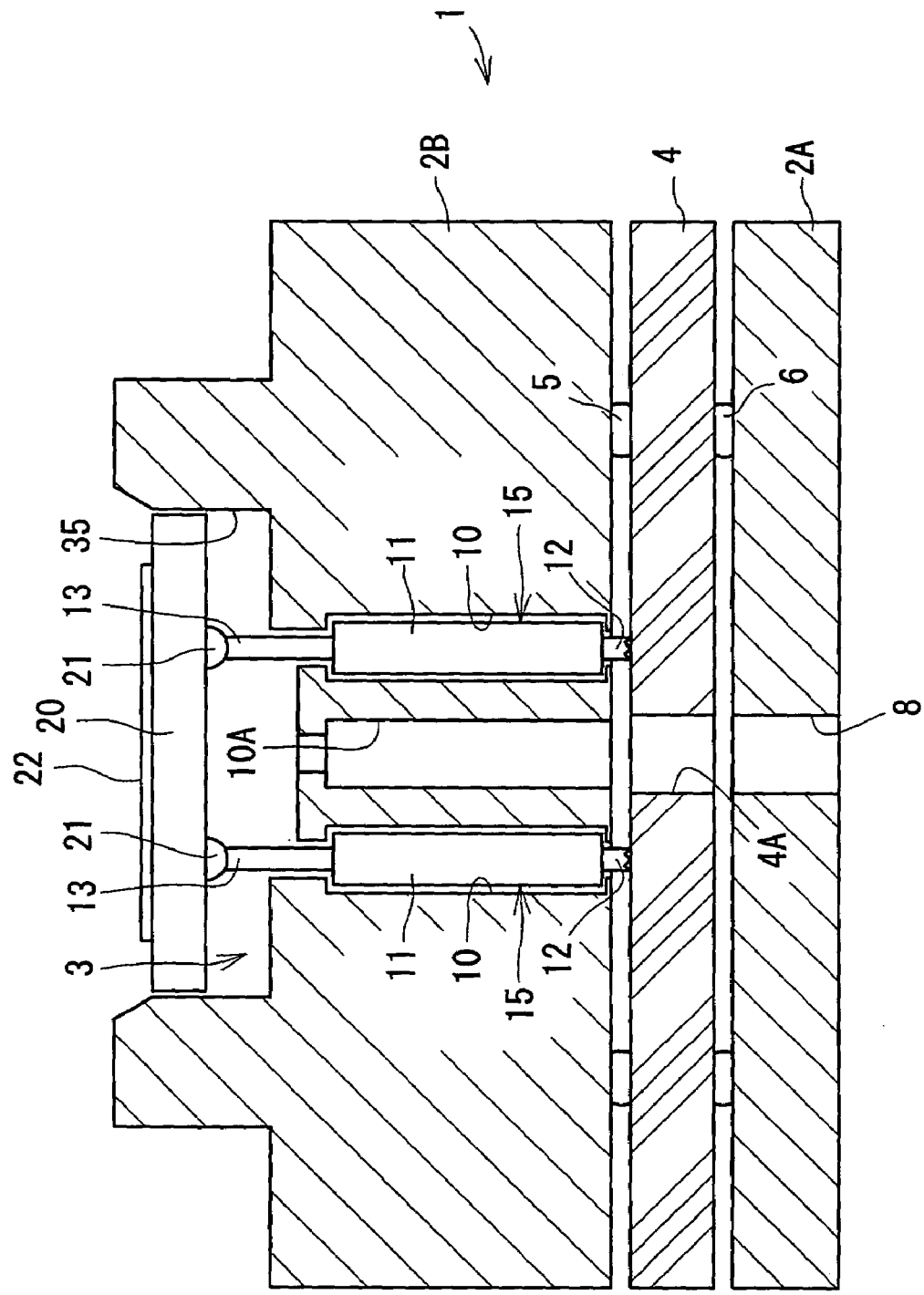
FIG. 6 is a cross-section of a jig device, which is forth embodiment of the present invention.

FIG. 6 shows a jig device other than above jig devices, which is the fourth embodiment of the present invention. As to this drawing, same numerical references are given to same parts as the first and second embodiments for a concise description.

The jig device 1 of FIG. 6 is not attached to a robot arm, since it can be moved by an appropriate means other than the robot arm. The jig device 1, as shown in FIG. 6, has a main jig part comprises a base part 2A and a front head part 2B. The front head part 2B has a holding part 3 which is a cavity formed in top of the front head part 2B. The cavity as a holding part 3 has vertical surrounding wall 35. An IC chip 20 falls into the holding part 3 and it is held there.

A suction paths 10 and 10A are there passing through the front head part 2B and these suction paths 10 and 10A are led to a vacuum pump, not illustrated, via suction paths 4A and 8 formed respectively in the printed circuit board 4 and in the base part 2A. Annular air seals 5 and 6 are provided between the parts. Contact probes 15 with contact pins 12, 13 and tubular holders 11 are also arranged in suction paths 10.

How to test or inspect performances of the IC chip 20 using such jig device 1 of the drawing will be explained bellow.

The IC chip 20 to be tested is attracted into the holding part 3 of the front head part 2B of main jig body by gripping it through suction paths 4A 8 and 10. At this time, inside atmosphere in these suction paths sucked by the vacuum pump and the IC chip 20 is attracted by the suction to the holding part 3.

Since upper contact pins 13 of contact probes 15 contact with corresponding terminals 21 of IC chip 20 by the sucking force, electrical properties of terminals 21 are tested by electrical current given to the contact probe 15 from the printed circuit board 4 in this state. An optical imaging element 22 takes an image according to a signal outputted from a printed circuit board 4 to this element. After such electrical and optical test are completed, the jig device 1 is moved to a take-out tray for by an appropriate conveying means and then the operation of a vacuum pump is suspended to discharge the IC chip 20. Thereafter, it moves to next steps to test the following IC chip.

In the fourth embodiment described above, the substantially same advantageous effects as the first and second embodiments is acquired. In addition to them, contact pins 13 can be contacted with terminals 21 without any pressing means to push down the IC chip 20, since the holding part 3 for the IC chip 20 faces up and suction paths 10 and 10A opens in the cavity as the holding part 3. As the result, the structure of the jig device 1 can be more simplified and, further, sucking force during test procedures of the IC chip 20 can be minimized.

FIG. 7 shows an alternative jig device, which is fifth embodiment of this invention. Same numerical references are given to same parts as the first and second embodiments also in this drawing.

In the jig device 1 of the FIG. 7, a main jig body 2 is constituted as a single part and a printed circuit board 4 is arranged just under the robot arm 50. As indicated in the drawing, the main jig body 2 is attached to the bottom of the printed circuit board 4. Suction paths 10 are communicated to a vacuum pump through suction paths 4A and 9. The IC chip 20 is attracted by suction to stick onto a holding part 3 of the main jig device 2, as same as the first and second embodiments described above. Contact probes 15 comprising first and second contact pins 12 and 13 are prepared in the suction paths 10 of the main jig body 2. The jig device 1 can be used in same way as above-mentioned jig devices 1 illustrated in FIGS. 1 and 4.

The jig device 1 of the fifth embodiment has a simple structure and therefore the jig device 1 is easy to be prepared and cost for manufacturing it can be reduced.

As understood from the above, any jig devise according to the present invention not only can transport IC chips, even if they have terminals and optical elements to be tested on almost whole surface or they are small and light chips, but also can conduct electric and optical tests of such IC chips, simultaneously. That is, both of conveying and testing of small lightweight IC chips can be conducted by same jig device.

The present invention has been described in detail with respect to various embodiments. It will now be apparent from the foregoing to those skilled in the art that changes and modifications may be made without departing from the invention, and, therefore, the appended claims cover all such changes and modifications so far as fall within the concept of the present invention. For example, although the contact probe is elastic and accommodated in a suction path in the above embodiments, non-elastic one can be used in the jig device of this invention and it may be arranged in the main jig body at other than the suction path. Furthermore, although tests as to electrical and optical performances of the IC chip are conducted in the above embodiments, another properties such thermal or mechanical properties can be examined.

What is claimed is:

1. A jig device useful for transporting and testing a semiconductor integrated circuit chip comprising:
    (i) a main jig body composed essentially of a non conductive material having a cavity on a surface thereof, and at least one internal suction path;
    (ii) a positioning platform arranged in said cavity with at least one spring, said positioning platform having a cone shaped holding part into which said semiconductor integrated circuit chip is fitted and at least one suction path connected to said internal suction path of a main jig body; and
    (iii) at least one contact probe being fitted in said main jig body, penetrating said positioning platform and electrically connecting at least one terminal of said semiconductor integrated circuit chip to at least one electrode to a test circuit board when said semiconductor integrated circuit chip being transferred while gripped in said positioning platform is pressed on a pressing stand.

2. A jig device as set forth in claim 1, in which said main jig body comprises:
    a base part having at least one internal suction path therein; and
    a front head part having at least one internal suction path therein connected to said at least one suction path in said base part and said cavity on a surface thereof.

3. A jig device as set forth in claim 2, in which said cone-shaped holding part formed on said positioning platform is a cavity having a tapered entrance and a vertical surrounding wall.

4. A jig device as set forth in claim 2, in which said test circuit board is arranged between said base part and said front head part.

5. A jig device as set forth in claim 3, in which said test circuit board is arranged between said base part and said front head part.

6. A jig device for simultaneously transporting and testing a semiconductor integrated circuit chip using a robotic arm, said chip having a first surface comprising a plurality of terminals and an opposite surface comprising at least one optical element, the device comprising:
    (i) a main jig body comprising a non conductive material, said body having a cavity extending to a surface thereof and at least one internal suction path extending to said cavity;
    (ii) a spring loaded positioning platform in said cavity comprising a chip area for receiving said semiconductor circuit chip and at least one platform suction path connected to said internal suction path of said main jig body, the chip area also comprising a cone shaped entry section;
    (iii) at least one contact probe in said main jig body, extending into said positioning platform through said internal suction path for electrically connecting at least one terminal of said semiconductor integrated circuit chip to at least one electrode of a test circuit board; and
    (iv) a pressing stand for pressing said chip while gripped in said chip area against said contact probe without damaging said at least one optical element when said robotic arm places said chip on said pressing stand.

* * * * *